United States Patent
Murakami

[11] Patent Number: 5,969,398
[45] Date of Patent: *Oct. 19, 1999

[54] METHOD FOR PRODUCING A SEMICONDUCTOR DEVICE AND A SEMICONDUCTOR DEVICE

[75] Inventor: Takashi Murakami, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/026,436

[22] Filed: Feb. 19, 1998

[30] Foreign Application Priority Data

Aug. 7, 1997 [JP] Japan .................................. 9-213484

[51] Int. Cl.$^6$ .................................................. H01L 29/94
[52] U.S. Cl. .......................... 257/412; 257/917; 438/523
[58] Field of Search .................................... 257/412, 917, 257/918, 102; 438/513, 514, 515, 517, 546, 547, 548, 918, 521, 529, 371, 374

[56] References Cited

U.S. PATENT DOCUMENTS 5,489,550  2/1996  Moshlehi ................................ 438/566
5,641,707  6/1997  Moslehi ................................ 438/513

FOREIGN PATENT DOCUMENTS 6-89904   3/1994  Japan .
7-142421  6/1995  Japan .
8-45867   2/1996  Japan .

OTHER PUBLICATIONS

"Radical Kinetics in a Fluorocarbon Etching Plasma," Jan. J. Appl. Phys. vol. 32 (1993) pp. 3040–3044.
"Formation of a fluorocarbon film having a high thermal resistance and a low dielectric constant, using plasma phase epitaxy" Appl. Phys. vol. 65, No. 11, 1996, pp. 1153–1157.
"Anomalous behavior of shallow BF3 plasma immersion ion implantation," J. Vac. Sci. Technol. B 12(2), 1994, pp. 956–961.
"LSI process engineering (2nd Ed.)," pp. 88–89, Ohm Co.

Primary Examiner—J. Carroll
Attorney, Agent, or Firm—McDermott, Will & Emery

[57] ABSTRACT

A method for producing a semiconductor device which comprises a step for forming a gate electrode on a main surface of a semiconductor substrate via a gate oxide film, and a step for directing plasma ions with a gas mixture comprising a first gas containing a hydride of an impurity element and a second gas containing a fluoride of the impurity element into a surface of the semiconductor substrate.

10 Claims, 8 Drawing Sheets

ELECTRIC SOURCE

ELECTRIC SOURCE

METHOD FOR PRODUCING A SEMICONDUCTOR DEVICE AND A SEMICONDUCTOR DEVICE

BACKGROUND OF THE INVENTION

The present invention relates to a method for producing a semiconductor device and a semiconductor device, more particularly to a method for producing a semiconductor device by using a plasma doping method and a semiconductor device.

Reflecting the trend to fine structure and high integration of semiconductor devices in recent years, it is required to form shallowly a source/drain junction of a MOS transistor and an extension portion as a medium concentration portion of a source/drain formed by e.g. LDD (Lightly Doped Drain). With the change of design rules in the trend to fine structure of MOS transistors, if the source/drain junction including the extension portion is not shallowly formed, drawbacks such as a short-channel effect are likely to occur.

Heretofore, an ion implantation method has been used for the formation of a source/drain junction. However, the formation of a shallow source/drain junction by the ion implantation method has the following drawbacks. For the formation of a shallow source/drain diffusion layer junction by an ion implantation apparatus, it is required to implant ions with low energy. However, a high beam current is hardly obtained with low energy. This is mainly attributable to the fact that with the low energy, ion beams introduced from an ion source tend to diffuse and disperse until they reach a wafer. It takes a long time to obtain a predetermined implantation dose due to the less beam current, resulting in poor throughput.

Under such circumstances, a plasma doping method by which doping is feasible with high throughput even with low energy, attracts attentions. Especially with respect to a low energy doping of boron (B) which exhibits poor throughput by an ion implantation apparatus, studies have been intensively made.

With respect to the plasma doping, the following prior art documents are mentioned.

First, JP-A-8-45867 describes that to improve the ionization probability of phosphine gas, an ion shower with phosphine gas diluted with hydrogen gas and helium gas is used for the formation of source/drain regions.

Further, JP-A-7-142421 describes that plasma ion implantation of Ge and Si into a semiconductor substrate is conducted to induce preamorphized state, and then plasma ion implantation of P-type or N-type ions as impurities is conducted.

Moreover, JP-A-6-89904 describes that plasma ion implantation of trivalent or pentavalent impurities in plasma state diluted with hydrogen or helium, is conducted for formation of an impurity region.

As described above, documents concerning the gas composition for plasma doping and technics concerning source/drain regions are found in the prior art.

Problems of conventional plasma doping methods wherein $B_2H_6$ is used as a main gas of dopant will be explained.

FIG. 14 is a cross-sectional schematic view of a device when doping is carried out on source/drain and a gate electrode of a surface channel type PMOS transistor by using $B_2H_6$ as the main gas of dopant.

In FIG. 14, 51 is a semiconductor substrate, 52 is an oxide film for separation of elements formed on the semiconductor substrate 51 by a LOCOS method (Local Oxidation of Silicon), 53 is a gate oxide film formed on the semiconductor substrate 51, 54 is a gate electrode formed on the gate oxide film 53, 55 is source/drain regions, and 56 is an electron trap generated in the gate oxide film 53.

Then, with reference to the cross-sectional schematic view of a device as shown in FIG. 14, a production method will be explained.

First, an oxide film 52 for separation of elements is formed on a semiconductor substrate 51 by a LOCOS method. Then, a gate oxide film 53 is formed on the semiconductor substrate 51 by thermal oxidation, and an undoped-type polysilicon or an amorphous silicon is formed on the gate oxide film 53 by a CVD method. Then, through a resist process, patterning is conducted in the shape as shown in FIG. 14 by an anisotropic etching.

FIG. 14 shows the condition where a semiconductor substrate 51 is mounted on an electrode in a plasma doping apparatus which is not shown, and doping of impurities in plasma state is carried out on source/drain 55 and a gate electrode 54 of the semiconductor substrate 51. $B_2H_6$ as a dopant is usually diluted to 20% or less with hydrogen or the like for use, since it is extremely unstable as a single substance. When plasma is generated by using $B_2H_6$ diluted with hydrogen, ions such as $B^+$, $BH_x^+$ (x=1 to 6), $B_2H_x^+$ (x=1 to 6), $H_3^+$, $H_2^+$ or $H^+$ ions, or radicals such as $H^*$ (hereinafter * indicates to be a radical) are generated. However, the existence ratio of B+ in the plasma is low and the major part is hydrogen ions ($H_3^+$, $H_2^+$) or ions containing hydrogen ($B_2H_x^+$).

When 31 4 kV is applied to the electrode in the plasma doping apparatus which is not shown, to carry out the doping of $B_2H_x^+$ at a ratio of $1\times10^{15}$ cm$^{-2}$ at 4 keV, a large amount of $H_3^+$ exists in the plasma and accelerated by 4 keV to undergo doping into the semiconductor substrate 51. In this case, $B_2H_x^+$ does not pass through the gate electrode 54, but hydrogen passes beyond the gate electrode 54 and is doped into the gate oxide film 53 at a level of $1\times10^{17}$ cm$^{-3}$. The hydrogen causes an electron trap 56 in the gate oxide film 53. Then, the electron trap causes the drawback of deterioration of hot-carrier resistance.

Further, in another conventional plasma doping method, the main gas is $BF_3$ gas as a dopant.

FIG. 15 is a schematic view illustrating the principle of the plasma doping when $BF_3$ is used as the main gas. In FIG. 15, 57 is an electrode in the plasma doping apparatus, and 58 is a semiconductor substrate mounted on the electrode 57.

By applying a negative voltage to the electrode 57, positive ions in plasma state are attracted to the semiconductor substrate 58 and doped by an acceleration voltage. The electrons in the plasma move away from the semiconductor substrate 58. Usually, to prevent charging up, a negative pulse pattern voltage is applied to the electrode 57. Only during the negative voltage is applied, positive ions are implanted into the semiconductor substrate 58, and when the applied voltage becomes 0 or positive, the electrons are attracted to neutralize the charging up.

When the $BF_3$ gas is used as the main gas, positive ions of all the types existing in the plasma, i.e. $B^+$, $BF^+$, $BF_2^+$ and $F^+$, are doped at the same time into a wafer. However, the $BF_2^+$ ions having the highest existence ratio are widely used in an ion implantation method and cause no problem even if incorporated. Further, $BF^+$ and $F^+$ are considered to be less influential to the device, as well. Further, $BF_3$ gas is not flammable unlike $B_2H_6$, and accordingly, has a merit of easiness in handling from the viewpoint of safety.

However, as shown in FIG. 15, when the $BF_3$ gas is used, fluorine radical F* formed by decomposition of the gas performs etching of the surface of the semiconductor substrate 58, i.e. together with the doping of the positive ions, the etching of the semiconductor substrate surface by the fluorine radical F* proceeds concomitantly, resulting in a drawback of poor controllability of doping profile.

Further, the boron once doped in the surface of the semiconductor substrate is etched, whereby a drawback of a poor doping efficiency is caused.

The above problems are described in, for example, "Anomalous behavior of shallow $BF_3$ plasma immersion ion implantation", J. Vac. Sci. Technol. B12(2), Mar/Apr 1994, pp 956–961.

Here, prior art documents concerning plasma technologies using fluorine gas will be described.

As the prior art document concerning the plasma etching using fluorine gas, "LSI Process Engineering (2nd edition)" Ohm Co., pages 88–89, describes that if hydrogen is added to Freon during plasma etching, the formation of F* is prevented by the reaction of F* +H→HF, resulting in the reduction of etching rate of silicon.

Further, "Radical Kinetics in a Fluorocarbon Etching Plasma", Jpn. J. Appl. Phys. Vol. 32 (1993) pp. 3040–3044 describes that if plasma is generated by the addition of hydrogen gas to $CF_4$ gas, a reaction of H+F→HF is induced, resulting in the reduction of F in the plasma.

Furthermore, "Formation of carbon fluoride film having a high heat resistance and a low dielectric constant by using a plasma CVD method", applied physics Vol. 65, No. 11, 1996, pp 1153–1157, describes that if hydrogen or $C_2H_2$ is added to $C_4F_8$ gas to generate plasma, gettering of F* by H* is likely to occur to reduce the etching with F*, resulting in increase of a film-formation rate.

As described above, prior art documents concerning the plasma etching by using fluorine gas are found in the prior art.

Then, in the conventional plasma doping method, an inner wall or the like of a chamber wherein the plasma doping is conducted, undergoes sputtering by the plasma, resulting in a drawback that atoms of the material of the chamber inner wall tend to deposit on the semiconductor substrate. When the inner wall of the plasma chamber is made of a stainless steel type material, Fe, Cr or the like tends to deposit on the semiconductor substrate. With an Al type material, not only Al but also Fe or the like contained in a small amount tend to deposit on the semiconductor substrate, and such elements are known to increase a leakage current of a source/drain junction.

SUMMARY OF THE INVENTION

The present invention has been accomplished to solve the above problems. Namely, it is intended to provide a method for producing a semiconductor device and a semiconductor device, by which transistors having excellent device properties can be produced with high throughput without accompanying the deterioration of hot-carrier resistance due to the formation of a trap in a gate oxide film of a MOS transistor by the presence of hydrogen, or the poorness of the controllability or efficiencies of doping based on the etching of the semiconductor substrate surface by the presence of F*.

It is also intended to provide a method for producing a semiconductor device and a semiconductor device, by which it is possible to prevent the deposition of Fe, Cr and Al as plasma chamber materials onto a semiconductor substrate, to conduct plasma doping on the semiconductor substrate with good efficiency, and also to produce transistors having excellent device properties.

The method for producing a semiconductor device according to the present invention, comprises a step for forming a gate electrode on a main surface of a semiconductor substrate via a gate oxide film, and a step for directing plasma ions with a gas mixture comprising a first gas containing a hydride of an impurity element and a second gas containing a fluoride of the impurity element into a surface of the semiconductor substrate.

In the method for producing a semiconductor device according to the present invention, it is preferred that the step for directing plasma ions is conducted to carry out doping of the impurity element into the gate electrode.

In the method for producing a semiconductor device according to the present invention, it is preferred that the step for directing plasma ions is conducted to carry out doping of the impurity element into main surfaces of the semiconductor substrate located at both sides of the gate electrode for formation of a pair of source/drain regions.

In the method for producing a semiconductor device according to the present invention, it is preferred that the first gas is a main gas of the gas mixture, and the second gas is a subsidiary additive gas of the gas mixture.

In the method for producing a semiconductor device according to the present invention, it is preferred that the main gas is a diluted $B_2H_6$ gas, and the subsidiary additive gas is $BF_3$ gas.

In the method for producing a semiconductor device according to the present invention, it is preferred that the main gas is a $B_2H_6$ gas diluted with hydrogen gas, and the mixing ratio of the $B_2H_6$ gas, the hydrogen gas and the $BF_3$ gas is 16:64:20.

In the method for producing a semiconductor device according to the present invention, it is preferred that the first gas is a subsidiary additive gas of the gas mixture, and the second gas is a main gas of the gas mixture.

In the method for producing a semiconductor device according to the present invention, it is preferred that the main gas is $BF_3$ gas, and the subsidiary additive gas is a diluted $B_2H_6$ gas.

In the method for producing a semiconductor device according to the present invention, the mixing ratio of the $BF_3$ gas and $B_2H_6$ is 80:20.

In the method for producing a semiconductor device according to the present invention, it is preferred that by the step for directing plasma ions with a gas mixture, the doping of the impurity element into the gate electrode is carried out, and at the same time, a pair of source/drain regions are formed on main surfaces of the semiconductor substrate located at both sides of the gate electrode.

In the method for producing a semiconductor device according to the present invention, it is preferred to further comprises after the step for directing the plasma ions with the gas mixture to carry out the doping of the impurity element into the gate electrode, a step for forming an oxide film on the gate electrode having the impurity element doped therein, and a step for directing plasma ions with a gas mixture comprising a first gas containing a hydride of an impurity element and a second gas containing a fluoride of the impurity element using the oxide film as a mask to carry out doping of the impurity element into main surfaces of the semiconductor substrate located at both sides of the gate electrode for formation of a pair of source/drain regions.

In the method for producing a semiconductor device according to the present invention, it is preferred to further comprises a step for forming an oxide film which covers each of the main surfaces of the semiconductor substrate located at both sides of the gate electrode, between the step for forming the gate electrode on the main surface of the semiconductor substrate via a gate oxide film, and the step for carrying out the doping of the impurity element on the main surfaces of the semiconductor substrate located at both sides of the gate electrode to form a pair of source/drain regions.

The semiconductor device according to the present invention, comprises a semiconductor substrate, a gate electrode which is formed on a main surface of the semiconductor substrate via a gate oxide film, and a pair of source/drain regions formed at both sides of the gate electrode, wherein the junction depth from the top face of the semiconductor substrate in the pair of source/drain regions is from 10 nm to 100 nm.

Another semiconductor device according to the present invention comprises a semiconductor substrate, a gate electrode which is formed on a main surface of the semiconductor substrate via a gate oxide film, and a pair of source/drain regions formed at both sides of the gate electrode which are formed by directing plasma ions with a gas mixture comprising a first gas containing a hydride of an impurity element and a second gas containing a fluoride of the impurity element.

DESCRIPTION OF THE PREFERRED EMBODIMENTS

Now, preferred embodiments of the present invention will be described in detail with reference to the accompanying drawings.

EMBODIMENT 1

In this embodiment, a gas comprising a main gas containing $B_2H_6$ diluted with hydrogen gas and $BF_3$ added in an amount of about 20% based on the entire amount of the gas mixture, is used as a dopant.

Figure 1:
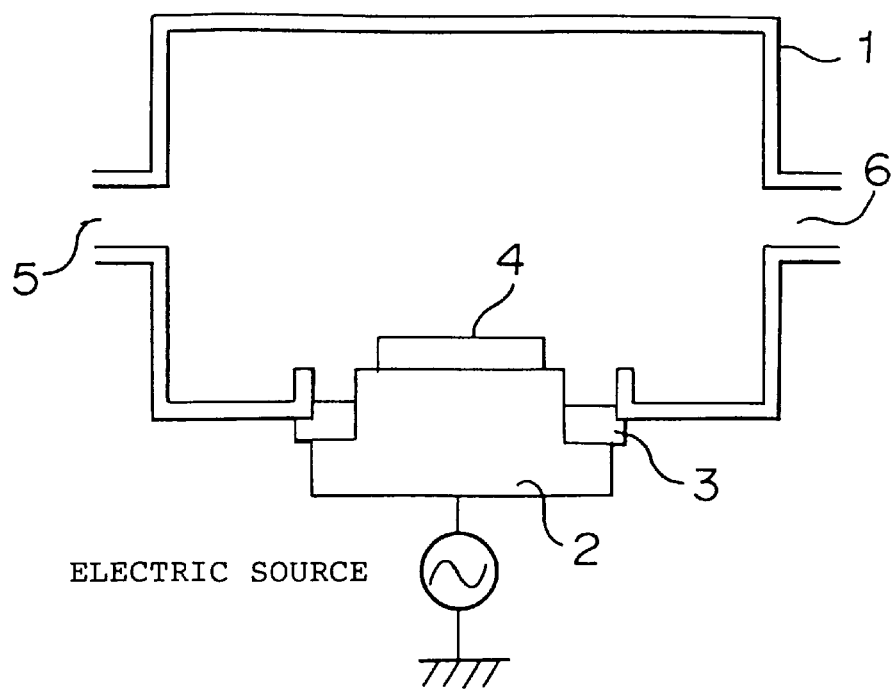
FIG. 1 is a cross-sectional view showing an example of the plasma doping apparatus in Embodiment 1 of the present invention.

FIG. 1 is a cross-sectional structural view showing an example of the plasma doping apparatus.

In FIG. 1, 1 is a chamber, 2 is an electrode, 3 is an insulator, 4 is a semiconductor substrate, 5 is a gas inlet and 6 is a gas discharge outlet. The semiconductor substrate 4 is placed on the electrode 2, the gas is introduced from the gas inlet 5, and plasma is generated within the chamber 1 by applying electric voltage to conduct doping of impurity ions into the semiconductor substrate 4.

Figure 2:
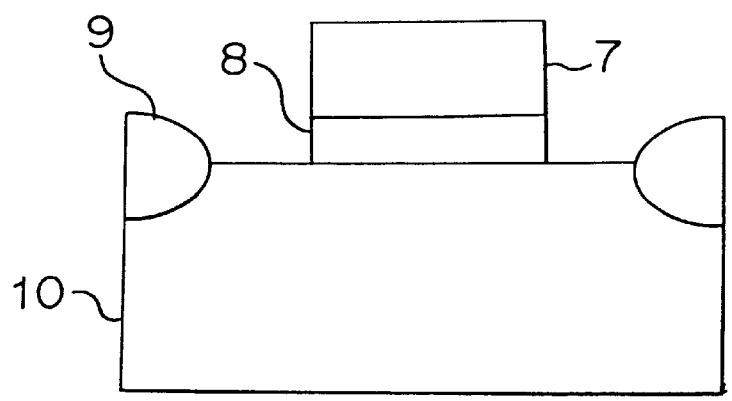
FIG. 2 is a cross-sectional view of a device illustrating the plasma doping in Embodiment 1 of the present invention.

FIG. 2 is a cross-sectional view of a surface channel type PMOS transistor device. In FIG. 2, 10 is a semiconductor substrate, 9 is an oxide film for separation of elements, formed on the semiconductor substrate 10 by a LOCOS (Local Oxidation of Silicon) method, 8 is a gate oxide film formed on the semiconductor substrate 10, and 7 is a gate electrode formed on the gate oxide film 8.

Then, a method for producing the cross-sectional structure of the device as shown in FIG. 2 will be described.

First, the oxide film 9 for separation of elements is formed on the semiconductor substrate 10 by the LOCOS method. Then, a gate oxide film is formed on the semiconductor substrate 10 by thermal oxidation, and an undoped type polysilicon or amorphous silicon is formed thereon in a film thickness of e.g. 800 Å (angstrom) by a CVD method. Then, through a resist process, patterning is conducted in the shape as shown in FIG. 2 by anisotropic etching.

Figure 3:
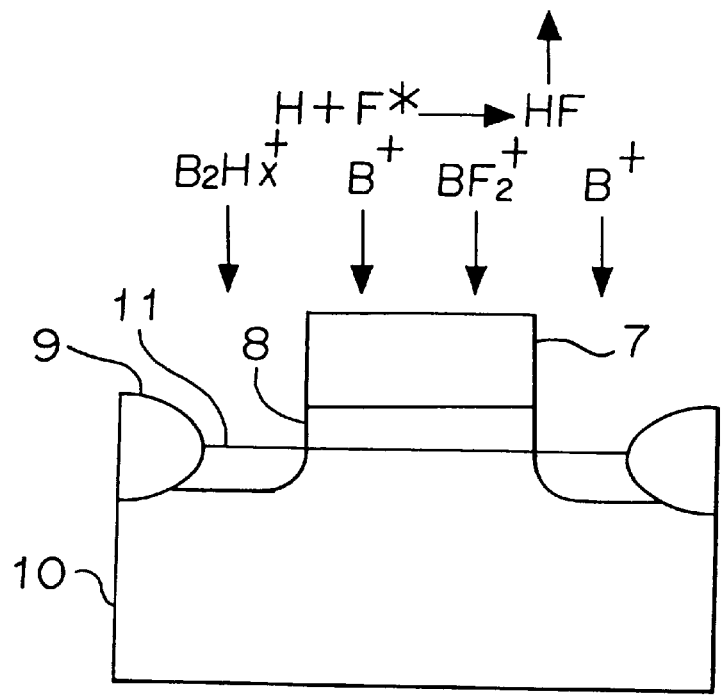
FIG. 3 is a cross-sectional schematic view of a device illustrating the plasma doping in Embodiment 1 of the present invention.

FIG. 3 is a cross-sectional schematic view of a device showing the condition where impurity ions are doped into the surface channel type PMOS transistor formed in FIG. 2. Using a gas mixture comprising a main gas containing $B_2H_6$ diluted with hydrogen gas and $BF_3$ added in an amount of about 20% based on the entire amount of the gas mixture, doping of impurity ions in plasma state is conducted into the gate electrode 7 and the main surfaces of the semiconductor substrate 10 located at both sides of the gate electrode 7. By the doping, a P-type gate electrode 7 and P-type source/drain regions 11 are formed.

As described above, in Embodiment 1 wherein $BF_3$ is added to $B_2H_6$ diluted with hydrogen gas, hydrogen formed by the decomposition of $B_2H_6$ or $H_2$ for dilution, and $F^*$ formed by the decomposition of $BF_3$ are reacted to form HF. The ionization of the $H_2$ gas for dilution can be suppressed by plasma conditions. Accordingly, due care is required for the hydrogen derived from the $B_2H_6$ gas.

Namely, $BF_3$ is added to the plasma in such an amount that the hydrogen formed by the decomposition of $B_2H_6$ and $F^*$ formed by the decomposition of $BF_3$ can be reacted with good balance. HF formed by the reaction of $F^*$ with hydrogen is exhausted through the gas discharge outlet. Namely, by the gettering of hydrogen by $F^*$, the amount of hydrogen doped into the semiconductor substrate can be suppressed. It is therefore possible to suppress the amount of the generated electron trap to a low level which causes no practical problem.

For example, under the conditions of plasma chamber pressure: 0.03 Pa, RF frequency: 100 MHz, dopant: 20% $B_2H_6$ diluted with hydrogen, and RF power: 100 W, the mixing ratio of the $B_2H_6$ gas: $H_2$ gas: $BF_3$ gas is preferably 16%:64%:20%. In this example, H ions are mostly in the form of $H_3^+$ and form in an amount of about 20% of the $B_2H_n$ ions. The $H_3$ ions are implanted into the gate oxide film to form a trap. $B_2H_6$ molecules of 16M in number (M is a constant) exist in 16 cc of the $B_2H_6$ gas, and if the decomposition efficiency is 100%, $B_2H_n$ ions of 16M in number and $H_3$ ions of 3.2M in number exit. For substitution of all the $E_3$ ions of 3.2M in number to HF, $F^*$ of 9.6M in number are required. In 20 cc of $BF_3$ gas, $BF_3$ molecules of 20M in number exist. Supposing that $F^*$ forms at a level of 30%, $F^*$ of 6M in number form and react with $H_3$ ions. As a result, the number of $H_3$ ions is reduced to (9.6M–6M)/3=1.2M in number, to suppress the formation of the electron trap.

EMBODIMENT 2

In the above Embodiment 1, the source/drain and gate electrode are subjected to plasma doping at the same time. However, when the doping is conducted at the same time, the doses into the source/drain and gate electrode are necessarily the same. In view of the performance of a transistor, it is sometimes required to conduct doping with different doses to the source/drain and gate electrode.

In Embodiment 2, the doping into the source/drain and gate electrode is conducted by separate steps.

Figure 4:
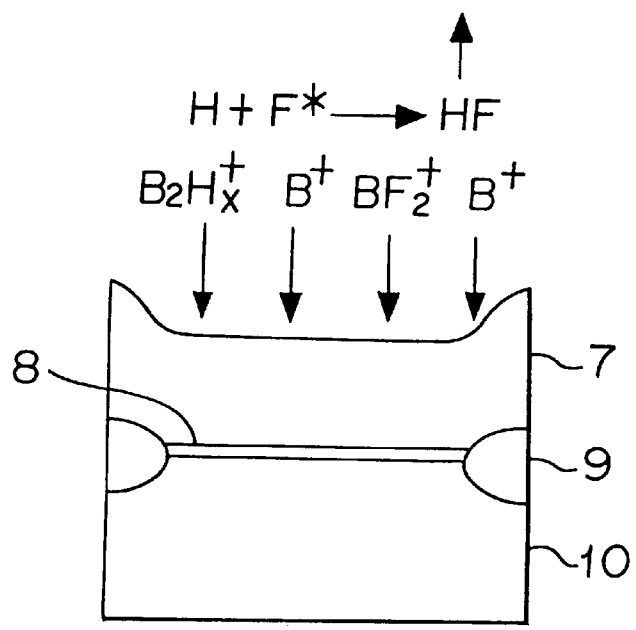
FIG. 4 is a cross-sectional schematic view of a device illustrating the plasma doping in Embodiment 2 of the present invention.
Figure 5:
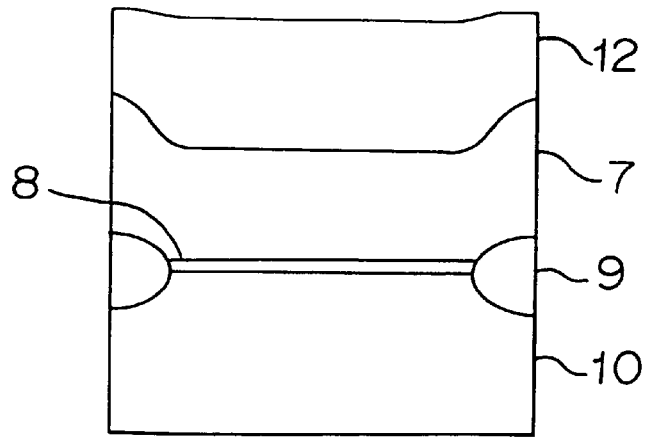
FIG. 5 is a cross-sectional schematic view of a device illustrating the plasma doping in Embodiment 2 of the present invention.
Figure 6:
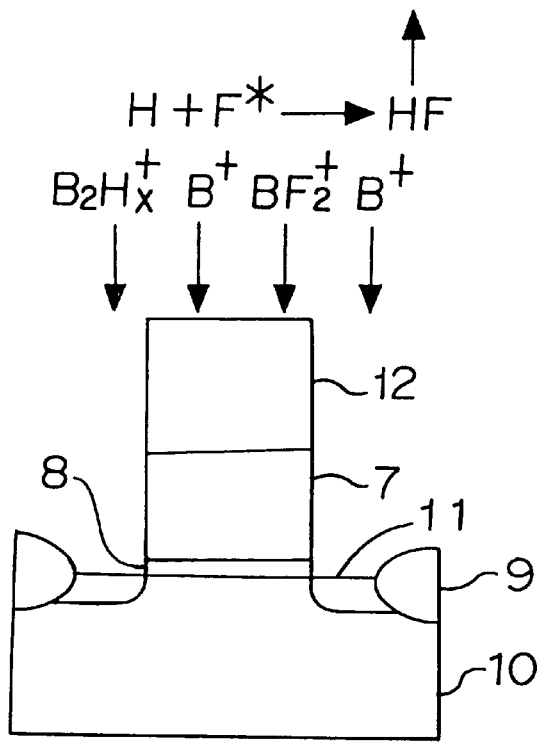
FIG. 6 is a cross-sectional schematic view of a device illustrating the plasma doping in Embodiment 2 of the present invention.

FIG. 4 to FIG. 6 are cross-sectional schematic views of a device showing a process wherein the same gas as used in Embodiment 1 is used as the main gas, and the gate electrode and source/drain regions are subjected to plasma doping with separate steps. Numerals 7 to 11 are the same as described in Embodiment 1.

FIG. 4 shows the condition wherein oxide films 9 for separation of a device are formed on a semiconductor substrate 10 by a LOCOS method, a gate oxide film 8 is formed by thermal oxidation, and on the gate oxide film 8, and film formation of undoped polysilicon or amorphous silicon as a gate electrode is conducted in a thickness of e.g. 800 Å. At first, to the undoped polysilicon or amorphous silicon, plasma doping is conducted by using the same gas as used in Embodiment 1. A P-type gate electrode 7 is thereby formed.

Then, as shown in FIG. 5, film formation of a TEOS oxide film 12 is conducted in a thickness of 1000 Å on the gate electrode 7. The TEOS oxide film 12 is a mask for preventing the impurity ions from entering the gate electrode during the doping into the source/drain. Then, using a resist not shown as a mask, the TEOS oxide film 12, gate electrode 7 and gate oxide film 8 are subjected to patterning by dry etching. Then, as shown in FIG. 6, to form source/drain regions 11, on main surfaces of the semiconductor substrate 10 located at both sides of the gate electrode 7, plasma doping is conducted by using the same gas as used in Embodiment 1. Further, after the formation of the source/drain regions 11, the TEOS oxide film 12 is removed.

In Embodiment 2, a gas mixture of $B_2H_6$ diluted with hydrogen and $BF_3$ is used as used in Embodiment 1, whereby the doped dose of hydrogen into the semiconductor substrate 10 can be suppressed. Accordingly, the amount of the generated electron trap can be suppressed to a low level which practically causes no problem.

Further, even if it is required to conduct the doping of the source/drain and gate electrode with different doses, such a requirement can be satisfied by conducting the doping by separate steps, and the source/drain and gate electrode can thereby be formed with different doses.

The above Embodiment 2 shows an example wherein the present invention is applied to a surface channel type PMOS transistor having a p-type gate electrode. However, the present invention can be applied to the doping of source/drain of a buried-channel type PMOS transistor having a n-type gate electrode. In this case, in the respective steps as shown in FIG. 4 to FIG. 6, instead of the undoped polysilicon or amorphous polysilicon, n-type polysilicon or amorphous polysilicon having phosphorus or arsenic doped, may be used for film formation, and the doping step into the gate electrode may be omitted.

Further, the above Embodiments 1 and 2 show typical examples wherein $B_2H_6$ diluted with hydrogen gas is used as the main gas, and $BF_3$ is added thereto. However, the same effects can be expected even if $B_2H_6$ gas diluted with e.g. helium or argon is used as the main gas.

In the above Embodiments 1 and 2, boron is used as the p-type impurity. However, phosphorus and arsenic as n-type impurities may be applied to a method for producing a semiconductor device by plasma doping using a n-type impurity, based on the same technical concept as in Embodiments 1 and 2.

Specifically, for example, $PH_3$ or $AsH_3$ diluted with hydrogen gas is used as the main gas, and $PF_3$ or $AsF_3$ is added thereto, whereby the same effects as in Embodiments 1 and 2 can be obtained.

Further, it is not necessary to use the same element for the main gas and additive gas. For example, $PH_3$ diluted with hydrogen gas may be used as the main gas and $AsF_3$ may be added thereto as the additive gas. In this case, As and P are doped at the same time, and the energy and implanted amount may be set taking the implanted ion distribution of each of the elements into consideration.

EMBODIMENT 3

In Embodiment 3, a gas comprising $BF_3$ as a main gas and $B_2H_6$ diluted with hydrogen, added in an amount of about 20% based on the entire amount of the main gas, is used as a dopant.

Figure 7:
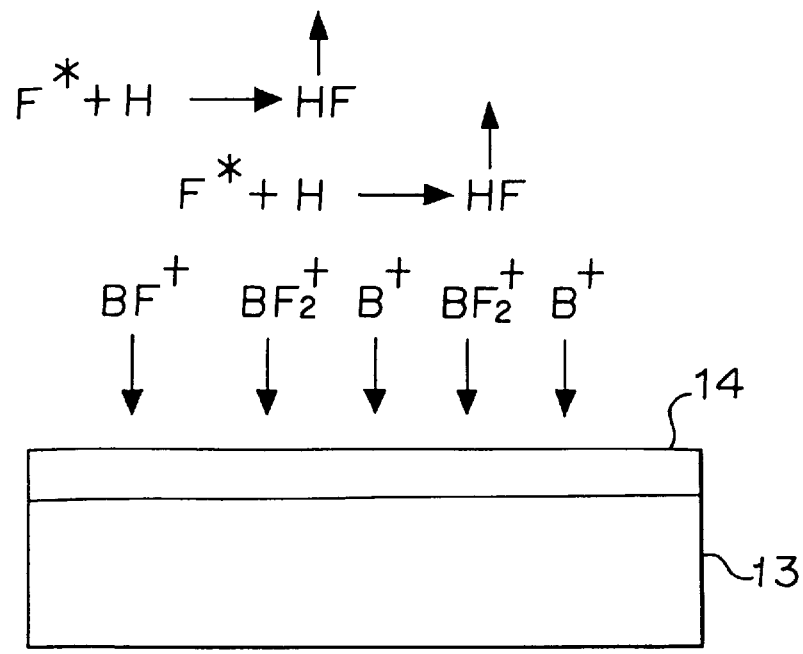
FIG. 7 is a cross-sectional schematic view of a device illustrating the plasma doping in Embodiment 3 of the present invention.

FIG. 7 is a cross-sectional schematic view showing the condition that doping of boron is conducted into $CoSi_2$ formed on a silicon substrate.

In FIG. 7, 13 is a silicon substrate and 14 is $CoSi_2$ formed on the silicon substrate 13. $CoSi_2$ is used for the gate electrode and source/drain of a logic MOS transistor, and can be formed by forming e.g. cobalt on the silicon substrate 13 by sputtering, followed by annealing.

Figure 8:
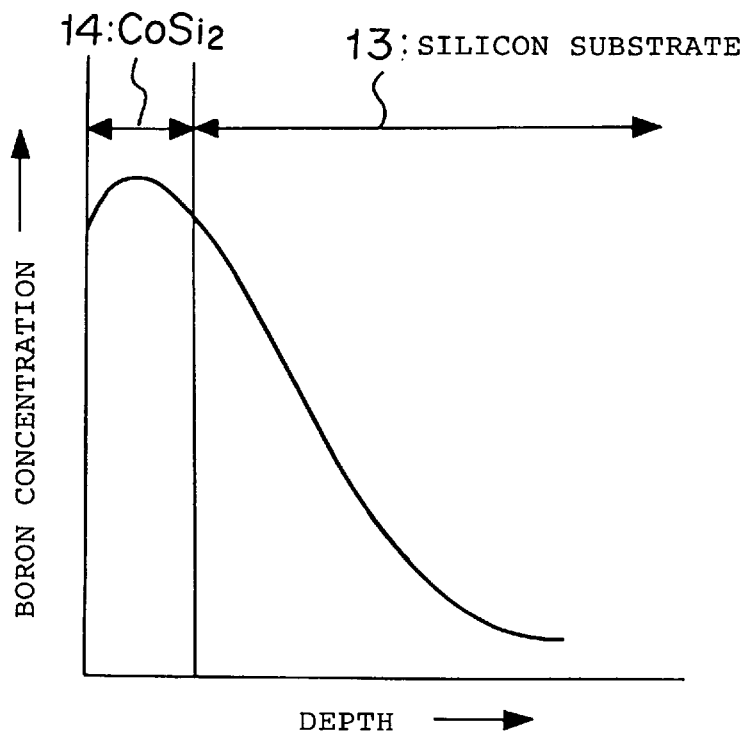
FIG. 8 is a schematic graph of a boron concentration distribution in Embodiment 3 of the present invention.
Figure 9:
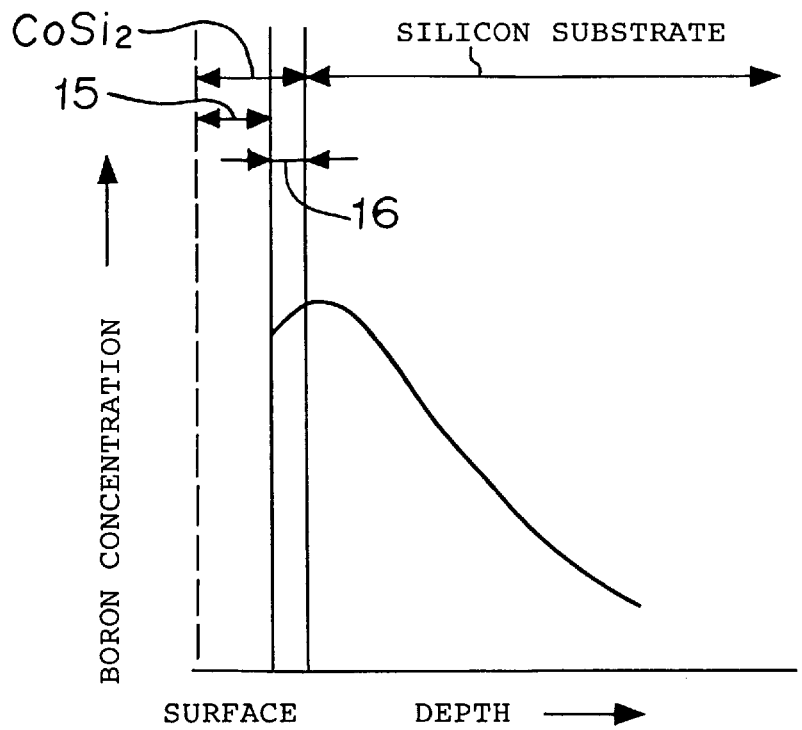
FIG. 9 is a schematic graph of a boron concentration distribution illustrating the problems of the prior art.

FIG. 8 and FIG. 9 are schematic views of distribution of boron concentration when boron is doped into $CoSi_2$ on the silicon substrate. FIG. 8 shows schematically the distribution of boron concentration in the depth direction from the surface of the silicon substrate in the cross-sectional schematic view of FIG. 7, and is a schematic view showing the doping profile when plasma doping is conducted with the gas composition as indicated in Embodiment 3 of the present invention.

FIG. 9 is a schematic view showing the doping profile when $BF_3$ gas alone is converted into a plasma state and used for plasma doping into $CoSi_2$ on the silicon substrate.

In FIG. 9, 15 is etched $CoSi_2$ and 16 is remaining $CoSi_2$.

In conventional methods using $BF_3$ gas alone as a dopant, $CoSi_2$ at the surface is etched and undergoes reduction of film as shown in FIG. 9, resulting in a problem that the resistance of the $CoSi_2$ layer increases. Further, the doping is conducted while conducting the etching, whereby the reproducibility of the doping profile is poor. Further, the uppermost surface portion once doped disappears by etching, whereby the doped amount is finally less than the preset dose, resulting in poor doping efficiency.

On the other hand, for the gas composition in Embodiment 3 of the present invention, a gas mixture comprising $BF_3$ and $B_2H_6$ diluted with hydrogen gas as an additive, is used, and it is therefore possible to obtain the doping profile which meets the design as shown in FIG. 8 with good reproducibility and also to suppress the problem that the etching is likely to occur. Further, reduction of doping efficiency can be suppressed as well.

When the $BF_3$ gas is used as the main gas, the $B_2H_6$ gas is preferably added in such an amount that F* formed by the decomposition of $BF_3$ reacts with hydrogen formed by the decomposition of $B_2H_6$ and no F* remains in the plasma.

Accordingly, the proportion of the $BF_3$ gas:$B_2H_6$ is suitably 80%:20%. Since $B_2H_6$ is diluted to about 20% with hydrogen gas, the mixing ratio of $BF_3$:$B_2H_6$:$H_2$ is preferably 44.5%:11.1%:44.4% as a whole.

By the addition of $B_2H_6$ diluted with hydrogen to the $BF_3$ gas, $H_3^+$, $H_2^+$ and $H^+$ ions and hydrogen radicals H* tend to form. These ions and radicals react with F* formed by the decomposition of the $BF_3$ gas and form HF. F* etches silicon, a silicon oxide film and a silicide such as $CoSi_2$, but HF does not etch silicon. Further, under the condition that no water content exits, HF does not etch the silicon oxide film also. In other words, gettering of F* as a reaction seed of etching is occurred by H* and suppress the etching. Further, since the reaction product is HF i.e. a gas, deposits are unlikely to form on the silicon substrate surface.

EMBODIMENT 4

Figure 10:
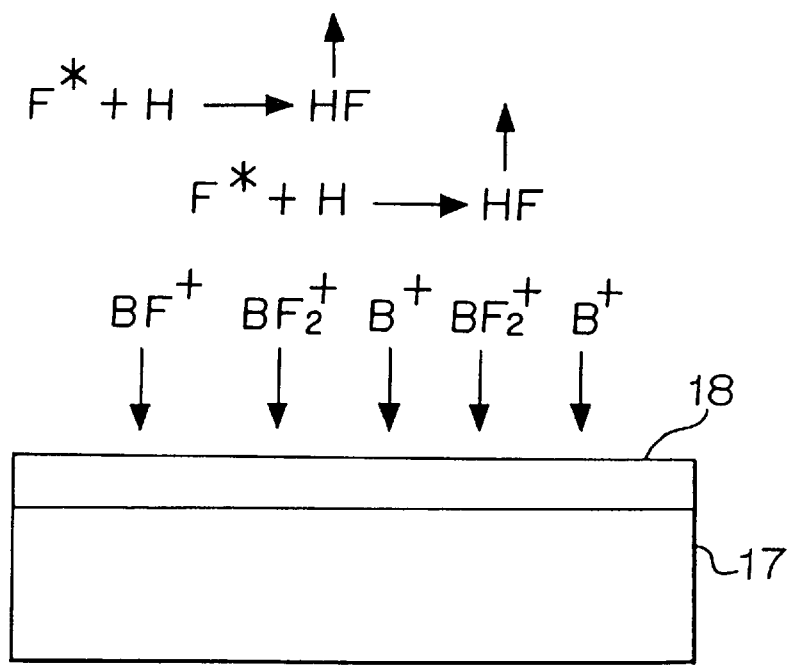
FIG. 10 is a cross-sectional schematic view of a device illustrating the plasma doping in Embodiment 4 of the present invention.

FIG. 10 is a cross-sectional schematic view showing the condition that doping of boron is conducted by using the same gas as used in Embodiment 3 on the silicon substrate surface through a screen oxide film.

In FIG. 10, 17 is a silicon substrate, and 18 is a screen oxide film comprising an oxide film of e.g. TEOS, formed on the silicon substrate 17.

Figure 11:
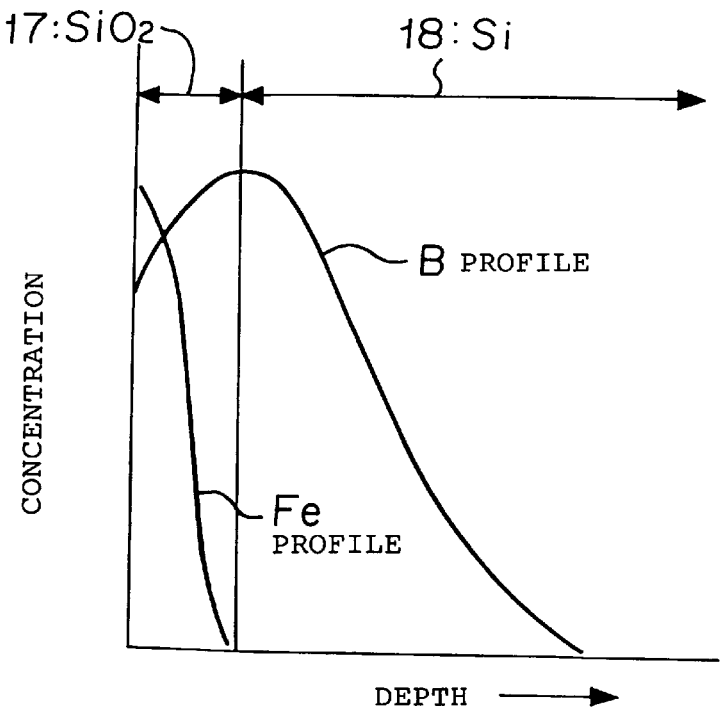
FIG. 11 is a schematic graph of a boron concentration distribution in Embodiment 4 of the present invention.
Figure 12:
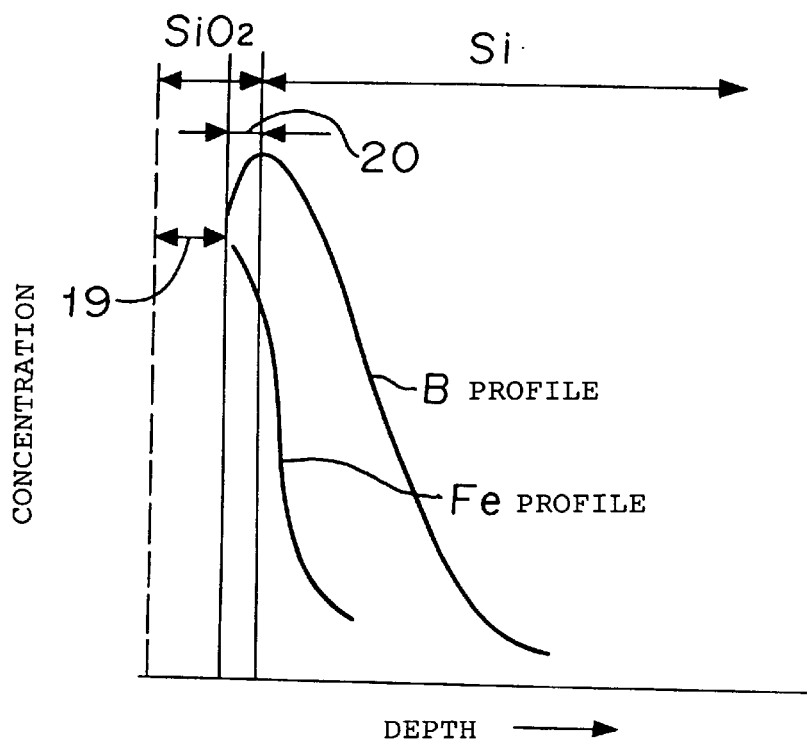
FIG. 12 is a schematic graph of a boron concentration distribution illustrating the problems of the prior art.

FIG. 11 and FIG. 12 are schematic views of the distribution of boron concentration when doping of boron is conducted on the semiconductor substrate surface through the screen oxide film. FIG. 11 shows schematically the boron concentration distribution in the depth direction from the surface of the silicon substrate in the cross-sectional schematic view of a device in FIG. 10, and is a schematic view showing the doping profile when plasma doping is conducted with the gas composition as described in Embodiment 3 of the present invention.

Further, FIG. 12 is a schematic view showing the doping profile when plasma doping is conducted by using the $BF_3$ gas alone in plasma state as conventionally conducted.

In FIG. 12, 19 is an etched silicon oxide film and 20 is a remaining silicon oxide film. The gas and plasma doping apparatus used are the same as used in Embodiment 3.

As shown in FIG. 10, doping is conducted under the condition that the screen oxide film 18 is formed in the thickness of e.g. 100 Å on the surface of the silicon substrate 17. Taking the oxide film formed in the thickness of 100 Å on the surface into consideration, the acceleration energy is set at an energy higher than the doping conditions for bare wafers. The acceleration energy is accurately determined by estimating the profile by simulation. For example, when the dopant is implanted with 10 keV and the condition that no screen oxide film is formed, the peak of concentration of the dopant is formed at around 150 Å from the surface (Rp=150 Å), and when the dopant is implanted into a wafer wherein a screen oxide film is formed in a thickness of 100 Å, if the implantation is conducted with 15 keV, the peak of concentration of the dopant is formed at the position of 250 Å from the oxide film i.e. 150 Å from the Si surface. Fe, Cr, Al or the like deposited by the sputtering does not have a high energy, and therefore does not enter the Si wafer beyond the screen oxide film. Namely, all these elements enter the inside of the screen oxide film.

Accordingly, if the silicon oxide film as the screen oxide film can be removed by etching with a hydrofluoric acid solution, the doping of boron can be conducted into the silicon substrate without contamination of metals.

If the plasma doping is conducted by using the $BF_3$ gas alone in plasma state as conventionally conducted, etching with F radicals is likely to occur, whereby the contamination of metals such as Fe may sometimes enter the silicon substrate 17 as shown in FIG. 12. Further, due to the unevenness in the thickness of the remaining oxide film, the profile of boron in the silicon substrate may be substantially uneven.

However, in Embodiment 4 of the present invention, the doping is conducted into the silicon substrate through the screen oxide film by using the gas mixture comprising $BF_3$ and $B_2H_6$ diluted with hydrogen gas as an additive, whereby it becomes possible to control the etching and to solve the above problems.

In FIG. 11, Fe as the metal contamination remains within the silicon oxide film, and is prevented from entering the Si substrate. By removing the screen oxide film by etching, the metal contamination components can be removed and the increase of junction leakage current can be suppressed.

Further, in the above Embodiments 3 and 4, $B_2H_6$ gas diluted with hydrogen gas is used as the subsidiary additive gas. However, the same effects can be expected even if $B_2H_6$ gas diluted with e.g. helium or argon is used as the subsidiary additive gas.

Then, application examples of Embodiment 4 will be explained in detail.

FIGS. 13(a) to 13(e) are partial cross-sectional structural views showing the flow chart of production method for forming source/drain regions of a semiconductor device with a screen oxide film.

In FIG. 13(a) to 13(e), 21 is a semiconductor substrate, 22 is an oxide film for separation of elements, 23 is a gate oxide film, 24 is a gate electrode, 25 is an oxide film, 26 is a side wall, 27 is a screen oxide film, 28 is a plasma ion and 29 is source/drain regions.

Figure 13A:
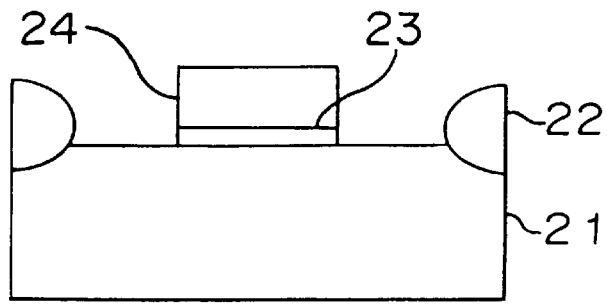
FIGS. 13(a) to 13(e) are partial cross-sectional structural views showing the flow chart of production as an application of the plasma doping in Embodiment 4 of the present invention.

First, as shown in FIG. 13(a), an oxide film 22 for separation of elements is formed on a semiconductor substrate 21 by a LOCOS method. Then, a gate oxide film 23 is formed on the semiconductor substrate 21 by thermal oxidation, and a gate electrode 24 is formed thereon.

Then, through a resist process, patterning is conducted in the shape as shown in FIG. 13(a) by anisotropic etching.

Figure 13B:
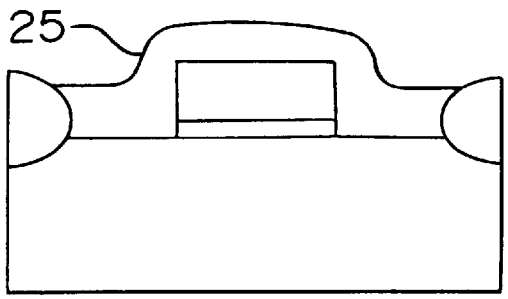
Figure 13C:
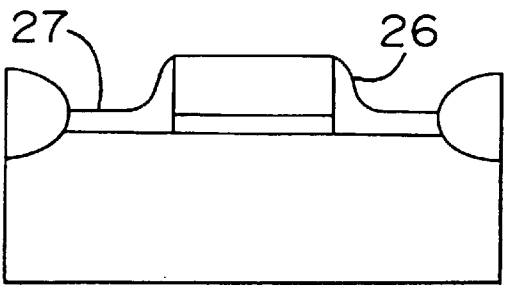

Then, as shown in FIG. 13(b), an oxide film of e.g. TEOS is deposited on the whole surface of the semiconductor substrate 21 to cover the gate electrode 24. As shown in FIG. 13(c), side walls are formed at both side faces of the gate electrode and a screen oxide film 27 is formed on the semiconductor substrate 21 by etch back.

Figure 13D:
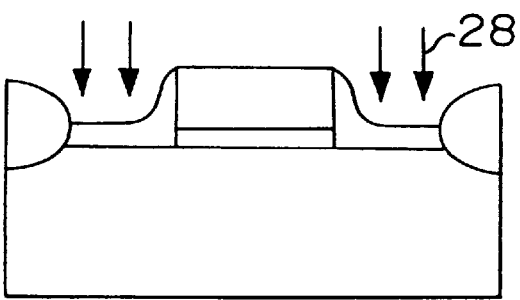

Subsequently, as shown in FIG. 13(d), doping of plasma ions 28 is conducted. As the dopant, the same gas as the gas described in Embodiment 3 is used.

Figure 13E:
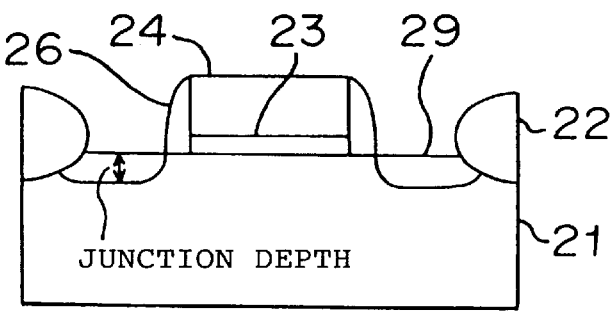
Figure 14:
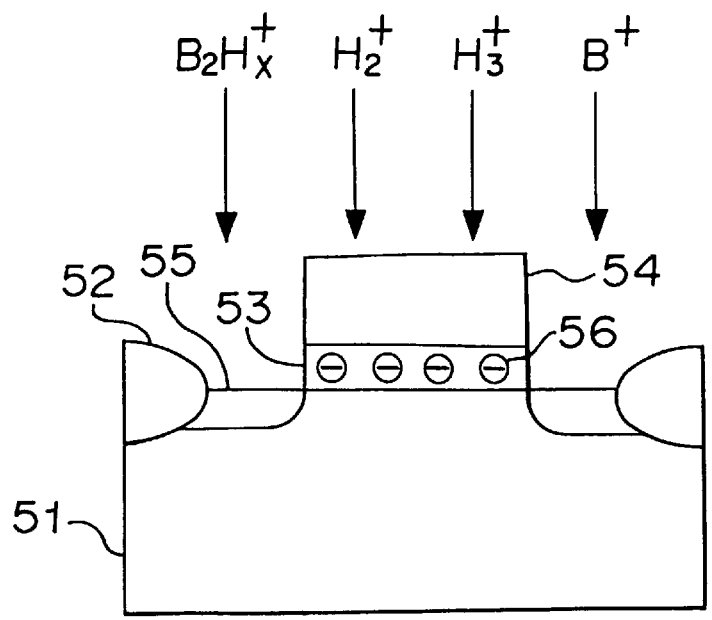
FIG. 14 is a cross-sectional schematic view illustrating the problems of the conventional plasma doping.
Figure 15:
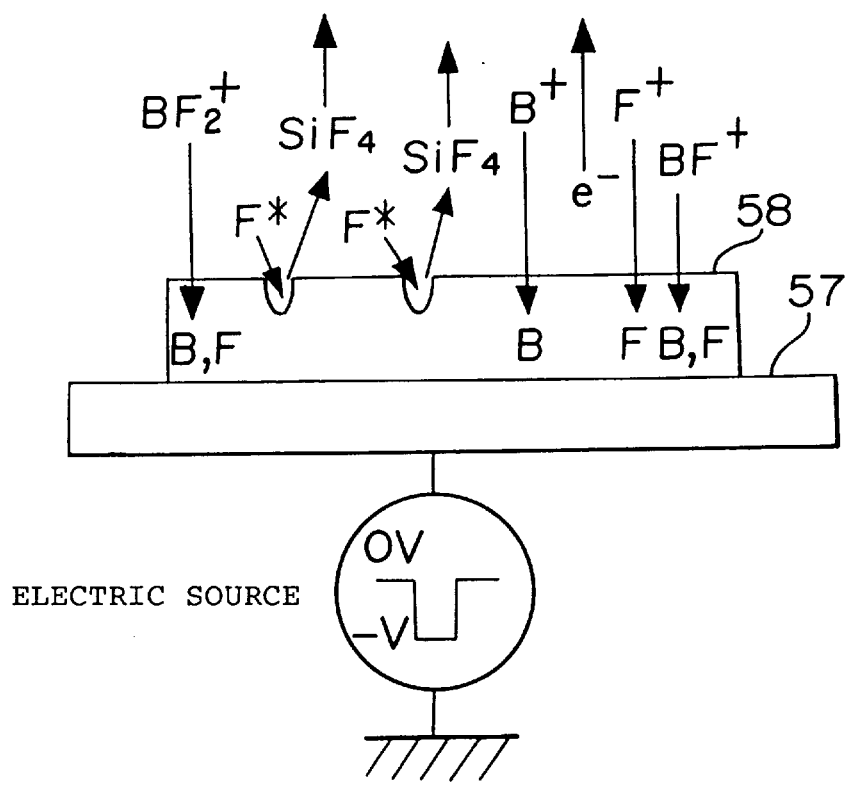
FIG. 15 is a cross-sectional schematic view illustrating the problems of the conventional plasma doping.

Then, as shown in FIG. 13(e), by removing the screen oxide film 27 by etching, it is possible to conduct doping of boron into the silicon substrate without metal contamination, and to form source/drain regions 29.

As described above, source/drain regions are formed by plasma doping using the gas mixture comprising the $BF_3$ and $B_2H_6$ diluted with hydrogen gas as an additive. Accordingly, Fe or the like as the metal contamination within the plasma doping apparatus remains in the screen oxide film and is removed after the doping, and therefore prevented from entering the semiconductor substrate 21. Accordingly, by removing the metal contamination components, leakage current at the source/drain junction can be suppressed and device properties can be improved.

In the formation of source and drain, it has been known that if a step for doping Ge or Si is added for the purpose of preamorphization before the step of plasma doping of boron, a shallow junction having higher properties can be obtained.

In wafers such as a silicon substrate, since atoms are regularly arranged in a crystalline state, even if impurity ions are implanted with a low energy, channeling phenomenon tends to occur and impurity ions will enter deeply the gaps of crystal lattice.

To prevent such a phenomenon, if doping of Ge or Si is conducted before the implantation of boron to make the lattice arrangement irregular (amorphization) and then impurity ions are implanted, it is possible to suppress the channeling and to form a shallow junction with good properties.

As impurity ions for the preamorphization, if a gas mixture comprising $GeF_4$ as a main gas and $GeH_4$ as an additive in a mixing ratio of $GeF_4:GeH_4=80:20$, is used for preamorphization based on the same technical concept as Embodiment 3 of the present invention, it is possible to suppress the channeling and form a shallow junction with good properties.

Further, according to the methods for producing a semiconductor device using the plasma doping methods of Embodiments 1 to 4, even if a limit arises in the formation of source/drain by the ion implantation method, a shallow source/drain junction can be formed with a high throughput.

For example, according to the methods for producing a semiconductor device using the plasma doping methods of Embodiments 1 to 4, it is possible to form a semiconductor device having a source/drain junction depth of from 10 nm to 100 nm (the source/drain depth from the top surface of the semiconductor substrate shown in FIG. 13(e)) without impairing device properties. The lower limit in this case is the junction depth of the source/drain corresponding to the limit in the production of fine structure of the semiconductor device, and the upper limit is the limit in practical use of the source/drain junction depth which can be formed by the ion implantation method.

For example, according to the method for producing a semiconductor device by plasma doping with boron as the impurity element, it is possible to form a semiconductor device having source/drain regions with a junction depth of at most 70 nm, a source/drain concentration of $5\times10^{13}$ to $1\times10^{15}$ cm$^{-2}$, and a concentration at an extension portion of $1\times10^{13}$ to $5\times10^{14}$ cm$^{-2}$.

In the above description, the present invention is explained by using the term "plasma doping". However, a doping method referred to as plasma immersion ion implantation may be included within the broad sense of plasma doping. Namely, the present invention can be applied to all the doping methods wherein a wafer is directly exposed to plasma.

As described above, according to the method for producing a semiconductor device of the present invention which comprises a step for forming a gate electrode on a main surface of a semiconductor substrate via a gate oxide film, and a step for directing plasma ions with a gas mixture comprising a first gas containing a hydride of an impurity element and a second gas containing a fluoride of the impurity element into a surface of the semiconductor substrate, hydrogen formed by plasma formation and fluorine radicals formed by plasma formation are reacted and discharged from the chamber, whereby it is possible to suppress the influence of hydrogen or the influence of fluorine radicals to the semiconductor substrate and to produce a transistor having excellent device properties with a high throughput.

Further, according to another aspect of the method for producing a semiconductor device of the present invention wherein by the step for directing plasma ions with a gas mixture comprising a first gas containing a hydride of an impurity element and a second gas containing a fluoride of the impurity element into a surface of a semiconductor substrate to conduct doping of impurity elements to a gate electrode, whereby hydrogen formed by plasma formation and fluorine radicals formed by plasma formation are reacted, and it is therefore possible to suppress the influence of the hydrogen or fluorine radicals to the gate electrode and to improve the device properties of the semiconductor device.

Moreover, according to other aspect of the method for producing a semiconductor device of the present invention wherein by the step for directing plasma ions with a gas mixture comprising a first gas containing a hydride of an impurity element and a second gas containing a fluoride of the impurity element into a surface of the semiconductor substrate, doping of impurity elements is conducted on main surfaces of the semiconductor substrate located at both sides of a gate electrode and a pair of source/drain regions are formed, whereby it is possible to form a shallow source/drain junction with good properties along the trend to fine structure of the semiconductor device.

Furthermore, according to other aspect of the method for producing a semiconductor device of the present invention, the main gas is a diluted $B_2H_6$ gas and the subsidiary additive gas is $BF_3$ gas, whereby hydrogen ions or radicals formed by plasma formation of $B_2H_6$ diluted with e.g. hydrogen gas are treated by gettering with fluorine radicals of $BF_3$ gas as the subsidiary additive gas, it is therefore possible to suppress the doped amount of hydrogen into the semiconductor substrate and to improve the reliability of the semiconductor device.

Further, boron which exhibits a poor throughput by the ion implantation method, can be doped with a high throughput in the present invention.

Further, according to other aspect of the method for producing a semiconductor device of the present invention, the main gas is a $B_2H_6$ gas diluted with hydrogen gas, and the mixing ratio of the $B_2H_6$ gas, hydrogen gas and $BF_3$ gas is 16:64:20. This condition is the optimum condition for suppressing the amount of hydrogen in the plasma, and it is therefore possible to remove the hydrogen substantially perfectly and to improve the reliability of the semiconductor device.

Moreover, according to other aspect of the method for producing a semiconductor device of the present invention, the main gas is $BF_3$ gas and the subsidiary additive gas is a diluted $B_2H_6$ gas, whereby fluorine radicals as the reaction seed of etching can be treated by gettering by hydrogen formed by plasma formation of the $B_2H_6$ gas, and it is therefore possible to suppress the etching of the semiconductor substrate by fluorine radicals and to improve the doping efficiency of boron.

Furthermore, according to other aspect of the method for producing a semiconductor device of the present invention, the mixing ratio of $BF_3$ gas to $B_2H_6$ is 80:20 and is the optimum condition wherein no fluorine radicals remain in the plasma, whereby fluorine radicals can be removed from the plasma substantially perfectly, and it is therefore possible to suppress the etching of the semiconductor substrate and to suppress the reduction of the doping efficiency.

Further, according to other aspect of the method for producing a semiconductor device of the present invention wherein by a step for directing plasma ions with a gas mixture, doping of impurity elements is conducted into a gate electrode, and at the same time, a pair of source/drain regions are formed on main surfaces of a semiconductor substrate located at both sides of the gate electrode, it is possible to conduct the doping into the source/drain regions and the doping into the gate electrode at the same time, and the processing steps are simplified.

Moreover, according to other aspect of the method for producing a semiconductor device of the present invention which comprises, after the step for directing the plasma ions with the gas mixture to carry out the doping of the impurity element into the gate electrode, a step for forming an oxide film on the gate electrode having the impurity element doped therein, and a step for directing plasma ions with a gas mixture comprising a first gas containing a hydride of an impurity element and a second gas containing a fluoride of the impurity element using the oxide film as a mask to carry out doping of the impurity element into main surfaces of the semiconductor substrate located at both sides of the gate electrode for formation of a pair of source/drain regions, if it is required to carry out doping for the source/drain and gate electrode with different doses, it is possible to satisfy such a requirement by conducting the doping with separate steps and to form the source/drain and gate electrode with different doses.

Furthermore, according to other aspect of the method for producing a semiconductor device of the present invention which further comprises a step for forming an oxide film which covers each of the main surfaces of the semiconductor substrate located at both sides of the gate electrode, between the step for forming the gate electrode on the main surface of the semiconductor substrate via a gate oxide film, and the step for carrying out the doping of the impurity element into the main surfaces of the semiconductor substrate located at both sides of the gate electrode to form a pair of source/drain regions, the metal contamination in the plasma doping apparatus generated during the doping for the formation of the pair of source/drain regions, remains within the oxide film and is prevented from entering the semiconductor substrate. Accordingly, the device properties of the semiconductor device can be improved.

Further, according to the semiconductor device of the present invention which comprises a semiconductor substrate, a gate electrode which is formed on a main surface of the semiconductor substrate via a gate oxide film, and a pair of source/drain regions formed at both sides of the gate electrode, wherein the junction depth from the top face of the semiconductor substrate in the pair of source/drain regions is from 10 nm to 100 nm, the source/drain junction is formed shallowly reflecting the trend to fine structure and causes no trouble such as short-channel effect.

Moreover, according to another aspect of the semiconductor device of the present invention which comprises a semiconductor substrate, a gate electrode which is formed on a main surface of the semiconductor substrate via a gate oxide film, and a pair of source/drain regions formed at both sides of the gate electrode which are formed by directing plasma ions with a gas mixture comprising a first gas containing a hydride of an impurity element and a second gas containing a fluoride of the impurity element, it is possible to produce a semiconductor device with a high throughput which is free from the influence of hydrogen or fluorine radicals to the semiconductor device and is excellent in the device properties.

What is claimed is:

1. A semiconductor device which comprises a semiconductor substrate, a gate electrode formed on a main surface of the semiconductor substrate via a gate oxide film, and a pair of source/drain regions formed at both sides of the gate electrode which are formed by directing plasma ions with a gas mixture comprising a first gas containing a hydride of boron and a second gas containing a fluoride of boron, a gas mixture comprising a first gas containing phosphine($PH_3$) and a second gas containing a fluoride of phosphorous, or a gas mixture comprising a first gas containing arsine($AsH_3$) and a second gas containing a fluoride of arsenic.

2. The semiconductor device according to claim 1, wherein the first gas is a main gas of the gas mixture, and the second gas is a subsidiary additive gas of the gas mixture.

3. The semiconductor device according to claim 2, wherein the main gas is a diluted $B_2H_6$ gas and the subsidiary additive gas is $BF_3$ gas.

4. The semiconductor device according to claim 3, wherein the main gas is a $B_2H_6$ gas diluted with hydrogen gas, and the mixing ratio of the $B_2H_6$ gas, the hydrogen gas and the $BF_3$ gas is 16:64:20.

5. The semiconductor device according to claim 3, wherein the main gas is $B_2H_6$ gas diluted with at least one selected from the group consisting of hydrogen, helium and argon.

6. The semiconductor device according to claim 1, wherein the first gas is a subsidiary additive gas of the gas mixture, and the second gas is a main gas of the gas mixture.

7. The semiconductor device according to claim 6, wherein the main gas is $BF_3$ gas, and the subsidiary additive gas is a diluted $B_2H_6$ gas.

8. The semiconductor device according to claim 7, wherein the mixing ratio of the $BF_3$ gas and $B_2H_6$ is 80:20.

9. The semiconductor device according to claim 7, wherein the subsidiary additive gas is $B_2H_6$ gas diluted with at least one selected from the group consisting of hydrogen, helium and argon.

10. A semiconductor device which comprises a semiconductor substrate, a gate electrode formed on a main surface of the semiconductor substrate via a sate oxide film, and a pair of source/drain regions formed at both sides of the gate electrode which are formed by directing plasma ions with a gas mixture comprising a first gas containing a hydride of boron and a second gas containing a fluoride of boron, a gas mixture comprising a first gas containing phosphine($PH_3$) and a second gas containing a fluoride of phosphorous, or a gas mixture comprising a first gas containing arsine($AsH_3$) and a second gas containing a fluoride of arsenic, wherein the gate electrode contains at least one impurity element selected from the group consisting of boron, phosphorus and arsenic.

* * * * *